United States Patent
Chou et al.

(10) Patent No.: US 12,451,391 B2
(45) Date of Patent: Oct. 21, 2025

(54) IMAGE SENSOR WITH DUAL TRENCH ISOLATION STRUCTURE

(71) Applicant: Taiwan Semiconductor Manufacturing Company, Ltd., Hsin-Chu (TW)

(72) Inventors: Cheng-Hsien Chou, Tainan (TW); Sheng-Chau Chen, Tainan (TW); Tzu-Jui Wang, Fengshan (TW); Sheng-Chan Li, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/320,523

(22) Filed: May 19, 2023

(65) Prior Publication Data
US 2023/0290672 A1    Sep. 14, 2023

Related U.S. Application Data

(62) Division of application No. 17/197,330, filed on Mar. 10, 2021, now Pat. No. 11,705,360.

(51) Int. Cl.
*H01L 21/762* (2006.01)
*H10F 39/00* (2025.01)
(Continued)

(52) U.S. Cl.
CPC ..... *H01L 21/76224* (2013.01); *H10F 39/024* (2025.01); *H10F 39/18* (2025.01); *H10F 39/199* (2025.01); *H10F 39/807* (2025.01)

(58) Field of Classification Search
CPC ........... H01L 21/76224; H01L 27/1463; H01L 27/1464; H01L 27/14643; H01L 27/14685;
(Continued)

(56) References Cited

U.S. PATENT DOCUMENTS

| 10,510,910 B2 | 12/2019 | Wu et al. |
| 2018/0219040 A1 | 8/2018 | Choi et al. |

(Continued)

FOREIGN PATENT DOCUMENTS

| CN | 111769126 A | 10/2020 |
| CN | 112331687 A | 2/2021 |

OTHER PUBLICATIONS

Park et al. "Pixel Technology for Improving IR Quantum Efficiency of Backside illuminated CMOS Image Sensor." Intl. Image Sensor Workshop, published Jun. 23, 2019.

(Continued)

*Primary Examiner* — Nelson Garces
(74) *Attorney, Agent, or Firm* — Eschweiler & Potashnik, LLC

(57) ABSTRACT

In some embodiments, the present disclosure relates to an image sensor. The image sensor comprises a substrate. A photodetector is in the substrate and includes a semiconductor guard ring extending into a first side of the substrate. A shallow trench isolation (STI) structure extends into the first side of the substrate. An outer isolation structure extends into a second side of the substrate, opposite the first side of the substrate, to the STI structure. The STI structure and the outer isolation structure laterally surround the photodetector. An inner isolation structure extends into the second side of the substrate and overlies the photodetector. The inner isolation structure is vertically separated from the photodetector by the substrate. Further, the outer isolation structure laterally surrounds the inner isolation structure.

20 Claims, 12 Drawing Sheets

(51) Int. Cl.
*H10F 39/12* (2025.01)
*H10F 39/18* (2025.01)

(58) Field of Classification Search
CPC ......... H01L 27/14625; H01L 27/14627; H10F 39/807; H10F 39/024; H10F 39/18; H10F 39/199; H10F 39/806; H10F 39/8063; H10F 39/014
See application file for complete search history.

(56) References Cited

U.S. PATENT DOCUMENTS

| | | |
|---|---|---|
| 2019/0027539 A1 | 1/2019 | Kim et al. |
| 2019/0035829 A1 | 1/2019 | Chang et al. |
| 2019/0067357 A1 | 2/2019 | Cheng et al. |
| 2019/0096929 A1 | 3/2019 | Chiang et al. |
| 2019/0165026 A1* | 5/2019 | Kuo ................... H01L 27/1463 |
| 2019/0386050 A1 | 12/2019 | Kim et al. |
| 2020/0058684 A1 | 2/2020 | Wu et al. |
| 2020/0075657 A1 | 3/2020 | Huang et al. |
| 2020/0105815 A1 | 4/2020 | Huang et al. |
| 2020/0135776 A1* | 4/2020 | Finkelstein ........... H10F 39/811 |
| 2020/0286942 A1* | 9/2020 | Jin ........................ H10F 39/805 |
| 2021/0013250 A1* | 1/2021 | Shim ................. H01L 27/14609 |
| 2022/0254818 A1* | 8/2022 | Park ...................... H10F 39/807 |

OTHER PUBLICATIONS

Non-Final Office Action dated Oct. 25, 2022 for U.S. Appl. No. 17/197,330.
Notice of Allowance dated Feb. 27, 2023 for U.S. Appl. No. 17/197,330.

* cited by examiner

IMAGE SENSOR WITH DUAL TRENCH ISOLATION STRUCTURE

REFERENCE TO RELATED APPLICATION

This Application is a Divisional of U.S. application Ser. No. 17/197,330, filed on Mar. 10, 2021, the contents of which are hereby incorporated by reference in their entirety.

BACKGROUND

Integrated circuits (ICs) with complementary metal-oxide-semiconductor (CMOS) image sensors are used in a wide range of modern-day electronic devices, such as, for example, cameras and cell phones. Some CMOS image sensors are based on avalanche photodiodes (APD) and single-photon avalanche photodiodes (SPAD).

An APD is a type of photodiode that exploits the photoelectric effect to convert light into electricity. An APD has a p-n junction that is reverse biased with a high voltage close to but not in excess of the breakdown voltage. An avalanche effect is triggered in response to incident radiation, which leads to current gain that is linearly related to the optical signal intensity. An SPAD is a type of photodiode similar to an APD. A SPAD has a p-n junction that is reverse biased with a high voltage similar to an APD. However, in contrast with an APD, the high voltage exceeds the breakdown voltage. As a result, a single photon incident on the SPAD may lead to a much more significant avalanche effect and hence a much more significant current gain. This, in turn, allows individual photons to be counted with SPADs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
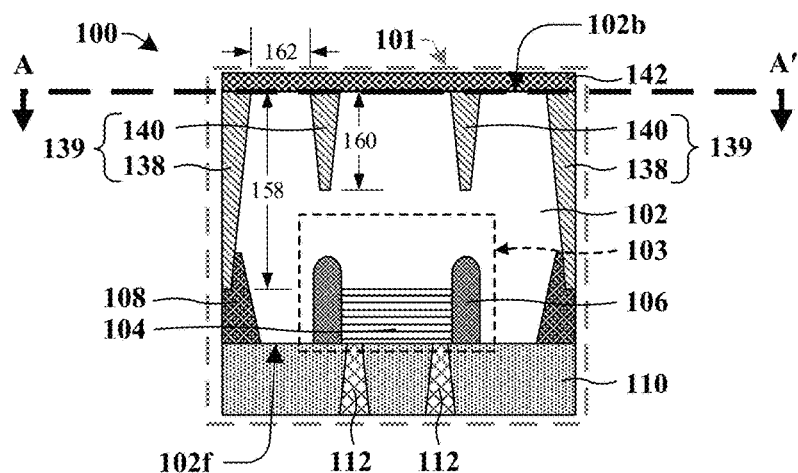
FIG. 1 illustrates a cross-sectional view of some embodiments of an image sensor comprising a dual trench isolation structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Complementary metal-oxide-semiconductor (CMOS) image sensors may be employed to detect near infrared (NIR) radiation. Such CMOS image sensors may, for example, be used for time-of-flight (ToF) sensors, surveillance cameras, and so on. However, CMOS image sensors may employ silicon-based photodiodes. For example, CMOS image sensors used for ToF sensors may employ single-photon avalanche photodiodes (SPADs) based on silicon. Silicon has a large band gap and is hence poor at absorption of NIR radiation. Therefore, CMOS image sensors may have poor quantum efficiency (QE) for NIR radiation. To mitigate this, several techniques may be employed. For example, a backside deep trench isolation (BDTI) structure and a high absorption (HA) structure may be employed to enhance absorption.

The BDTI structure extends into a backside of the substrate and individually surrounds each of the photodetectors. Further, the BDTI structure comprises a dielectric material having a refractive index less than that of the substrate to promote total internal reflection (TIR) at a BDTI interface between the BDTI structure and the substrate. Alternatively, the BDTI structure may comprise metal or some other suitable reflective material. Reflection by the BDTI structure reduces the likelihood of radiation passing between photodetectors and increasing crosstalk. Further, reflection by the BDTI structure reflects radiation back towards a photodetector at which the radiation was received, thereby giving the photodetector another opportunity to absorb the radiation. Hence, the BDTI structure may increase sensitivity and QE.

The HA structure is also on the backside of the substrate and corresponds to an HA interface between the substrate and an antireflective layer. The HA interface has protrusions and depressions that scatter incident radiation. The scattering increases the likelihood that the BDTI structure will reflect the radiation back towards a photodetector at which the radiation was received, thereby giving the photodetector another opportunity to absorb the radiation. Further, the antireflective layer has a refractive index less than that of the substrate to promote TIR at the HA interface. As such, the HA structure reflects radiation back towards a photodetector at which the radiation was received, thereby giving the photodetector another opportunity to absorb the radiation. Hence, the HA structure may increase sensitivity and QE.

A challenge with enhancing absorption with the BDTI structure and the HA structure is that forming the HA structure along the backside of the substrate may be an expensive process and/or a complex process. For example, formation of the HA structure may depend upon an expensive photomask and/or a complex series of etching processes.

Various embodiments of the present disclosure are directed toward an integrated chip including an image sensor, the image sensor comprising a dual trench isolation structure for improving the QE of the image sensor while reducing the cost and complexity of forming the image sensor. The image sensor may include a plurality of pixels along a substrate. A pixel of the plurality of pixels comprises a photodetector in the substrate and a dual trench isolation structure in the substrate. The photodetector is on a front side of the substrate and comprises a first semiconductor region in the substrate and a guard ring in the substrate surrounding the first semiconductor region. The dual trench isolation structure is on a back side of the substrate, opposite the front side, and comprises an outer isolation structure and an inner isolation structure. The outer isolation structure extends along a boundary of the pixel and laterally separates the pixel from neighboring pixels. The inner isolation structure extends into the substrate to a lesser depth than the outer isolation structure and is between inner sidewalls of the outer isolation structure. Further, the inner isolation structure is aligned to the photodetector. In some embodiments, the inner isolation structure is aligned with the guard ring such that the inner isolation structure is directly over or directly under the guard ring.

By disposing the dual trench isolation structure in the substrate such that the outer isolation structure laterally separates the pixel from neighboring pixels, crosstalk between pixels may be reduced. Furthermore, by disposing the dual trench isolation structure in the substrate such that the inner isolation structure is aligned with photodetector and between inner sidewalls of the outer isolation structure, photons entering the pixel may experience increased diffraction, refraction, and/or reflection in the substrate as a result of colliding with the inner isolation structure. This may increase the number of times the photons pass across the photodetector and may hence increase the likelihood of absorption by the photodetector. As a result, the QE of the image sensor may be increased, thereby increasing the performance of the image sensor and the integrated chip. Further, implementing the dual trench isolation structure in the image sensor may be a relatively simple and/or inexpensive process compared to implementing a HA structure. Thus, a cost of producing the image sensor may be reduced.

FIG. 1 illustrates a cross-sectional view 100 of some embodiments of an image sensor comprising a dual trench isolation structure 139. The cross-sectional view 100 may, for example, be taken across the line A-A' of any of FIGS. 2A-2C.

In such embodiments, the image sensor includes a pixel 101 along a substrate 102. The pixel 101 comprises a photodetector 103 in the substrate 102. The photodetector 103 comprises a first semiconductor region 104 in the substrate 102 and along a front side 102f of the substrate 102. The first semiconductor region 104 has a first doping type and the substrate 102 has a second doping type opposite the first doping type, such that a p-n junction exists at an interface between the first semiconductor region 104 and the substrate 102. The photodetector 103 also comprises a guard ring 106 in the substrate 102 along the front side 102f of the substrate 102 and along sidewalls of the first semiconductor region 104. The guard ring 106 laterally surrounds the first semiconductor region 104 and laterally separates the first semiconductor region 104 from the substrate 102. The guard ring has the same doping as the first semiconductor region 104 (e.g., the first doping type), but has a different (e.g., lesser) doping concentration than the first semiconductor region 104.

In some embodiments, contacts 112 may extend through a first dielectric layer 110 disposed on the front side 102f of the substrate 102 to the first semiconductor region 104 and may be electrically connected to the first semiconductor region 104. The image sensor may further comprise a shallow trench isolation (STI) structure 108 disposed on opposite sides of the photodetector 103 along boundaries between the pixel 101 and neighboring pixels. In addition, an anti-reflective coating (ARC) layer 142 may be disposed along the back side 102b of the substrate 102.

The image sensor further comprises a dual trench isolation structure 139 in the substrate 102. The dual trench isolation structure comprises an inner isolation structure 140 and an outer isolation structure 138. The outer isolation structure 138 may extend into the substrate 102 from a back side 102b of the substrate 102 to a first depth 158 and the inner isolation structure 140 may extend into the substrate 102 from the back side 102b of the substrate 102 to a second depth 160 that is less than the first depth 158. The outer isolation structure 138 may be directly over the STI structure 108 and may extend into the STI structure 108. The inner isolation structure 140 is directly over the guard ring 106 and may be vertically separated from the guard ring 106 by the substrate 102. The outer isolation structure 138 laterally surrounds the inner isolation structure 140. Further, the outer isolation structure 138 may be laterally separated from the inner isolation structure 140 by the substrate 102. Furthermore, the outer isolation structure 138 and the STI structure 108 together may laterally separate the pixel 101 from neighboring pixels.

By disposing the dual trench isolation structure 139 in the substrate 102 such that the inner isolation structure 140 is over the photodetector 103 and is directly over the guard ring 106, photons entering the substrate 102 may collide with the inner isolation structure 140. In turn, the photons may experience increased diffraction, refraction, and/or reflection in the substrate 102. This may increase the number of times the photons pass across the photodetector 103 and may hence increase the likelihood of absorption by the photodetector 103. As a result, the QE of the image sensor may be increased, thereby increasing the performance of the image sensor and the integrated chip.

While FIG. 1 illustrates a single pixel 101 of the image sensor, it will be appreciated that the image sensor may include some other number of the pixels along the substrate 102.

In some embodiments, the photodetector 103 may, for example, be or comprise a photodiode, an avalanche photodiode (APD), a single-photon avalanche photodiode (SPAD), or the like.

The substrate 102 may, for example, be or comprise a semiconductor such as silicon or the like. The first semiconductor region 104 and the guard ring 106 may, for example, comprise doped silicon, some other semiconductor, or the like. In particular, the first semiconductor region 104 and the guard ring 106 may, for example, comprise n-type doping or p-type doping.

The first dielectric layer 110 may, for example, be or comprise silicon dioxide, silicon nitride, some other dielectric, or any combination of the foregoing.

The contacts 112 may, for example, be or comprise tungsten, copper, titanium, some other metal, or any combination of the foregoing.

The ARC layer 142 may comprise an anti-reflective material. For example, the anti-reflective material may comprise silicon dioxide, silicon nitride, silicon oxynitride, some metal oxide material, some other suitable material, or any combination of the foregoing. In some embodiments, the ARC layer 142 has a refractive index less than that of the substrate 102 to promote TIR at the interface between the ARC layer 142 and the substrate 102. Such TIR may, for example, reflect radiation towards the photodetector 103 to improve QE.

The STI structure 108 may, for example, be or comprise silicon dioxide, silicon nitride, some other dielectric material, or any combination of the foregoing. In some embodiments, the STI structure 108 has a refractive index less than that of the substrate 102 to promote TIR at the interface between the STI structure 108 and the substrate 102. Such TIR may, for example, reflect radiation towards the photodetector 103 to improve QE.

In addition, the dual trench isolation structure 139 comprises one or more isolation materials. The one or more isolation materials may, for example, comprise silicon dioxide, silicon nitride, hafnium oxide, aluminum oxide, zinc oxide, some other dielectric material, tungsten, copper, some other metal material, or any combination of the foregoing. In some embodiments, the dual trench isolation structure 139 is or comprises a reflective material, such as a metal or some other suitable material. Further, in some embodiments, the dual trench isolation structure has a refractive index less than that of the substrate 102 to promote TIR at the interfaces between the dual trench isolation structure 139 and the substrate 102. As described above, reflection by the dual trench isolation structure 139 may, for example, improve QE.

The first depth 158 may be about 2.5 micrometers to about 6 micrometers. The second depth 160 may be less than the first depth 158. Further, the second depth 160 may be less than about 2 micrometers, less than about 5.5 micrometers, or some other suitable depth. For example, the second depth 160 may be about 0.1 micrometers to about 5.4 micrometers. A first distance 162 between the outer isolation structure 138 and the inner isolation structure 140 may be about 0.2 micrometers to 2.2 micrometers. Further, a distance (not labeled) between inner sidewalls of the inner isolation structure 140 may be approximately equal to a distance (not labeled) between inner sidewalls of the guard ring 106.

The second depth 160 is less than the first depth 158 so that the inner isolation structure 140 does not extend into the guard ring 106 (i.e. so the inner isolation structure 140 does not affect the performance and/or reliability of the photodetector 103). Further, the first depth 158 is greater than the second depth 160 so that the outer isolation structure 138 extends though the substrate to isolate the pixel 101, thereby reducing crosstalk. The first distance 162 between the outer isolation structure 138 and the inner isolation structure 140 may be large enough that the inner isolation structure 140 is not laterally outside the guard ring 106 and small enough that the inner isolation structure 140 is not laterally inside the guard ring 106 (i.e., the first distance 162 may be chosen such that the inner isolation structure 140 is directly over the guard ring 106).

Figure 2A:
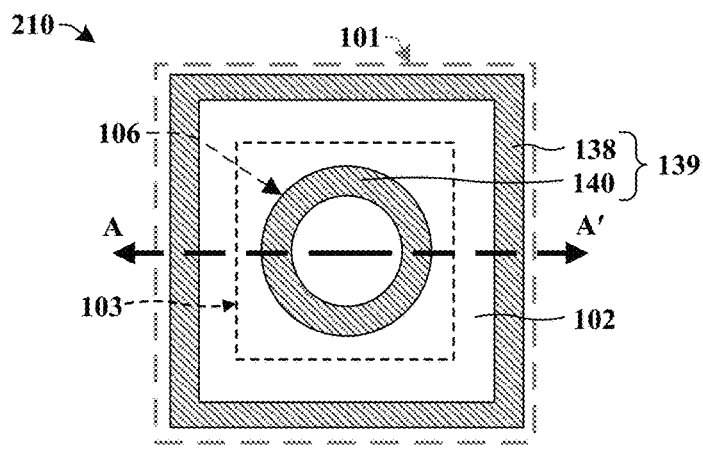
FIGS. 2A-2C illustrate top layout views of some embodiments of the image sensor of FIG. 1.
Figures 2B, 2C:
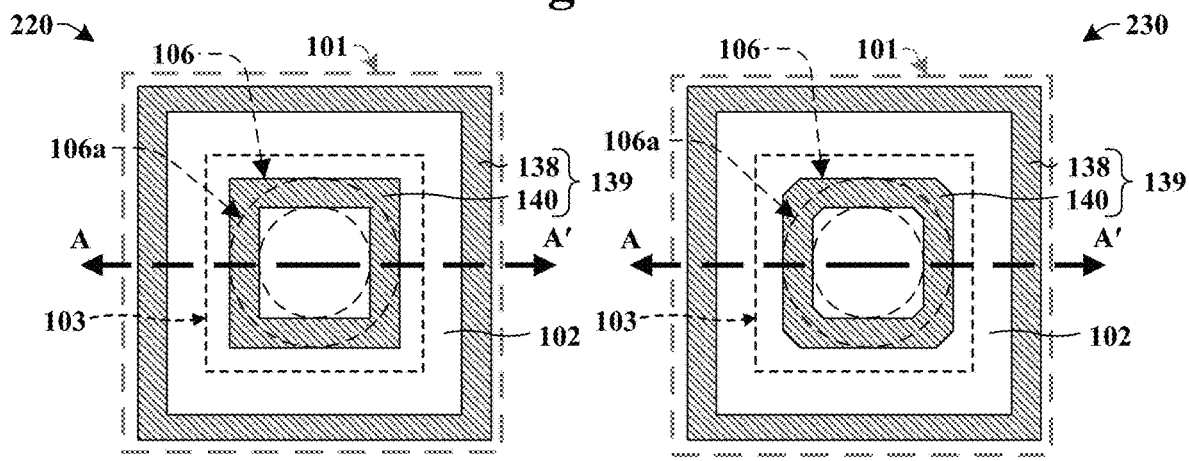

FIGS. 2A-2C illustrate top layout views 210-230 of some embodiments of the image sensor of FIG. 1.

The inner isolation structure 140 may be directly over the guard ring 106 such that the inner isolation structure 140 may have approximately the same top layout as the guard ring 106. Moreover, the inner isolation structure 140 may surround a center of the photodetector 103 along a first closed path (not labeled) and the guard ring 106 may also surround the center of the photodetector 103 along the first closed path.

The inner isolation structure 140 may have a rounded ring shape with smooth edges, as illustrated in FIG. 2A. Alternatively, the inner isolation structure 140 may have a squared ring shape as in FIG. 2B or a modified squared ring shape with tapered corners as in FIG. 2C.

While FIGS. 2A-2C illustrate the guard ring 106 having approximately the same top layout as the inner isolation structure 140, it will be appreciated that the guard ring 106 and the inner isolation structure 140 may have different top layouts. For example, as illustrated in FIGS. 2B and 2C, the guard ring 106 may instead have a rounded ring shape (e.g., 106*a*).

Figure 3:
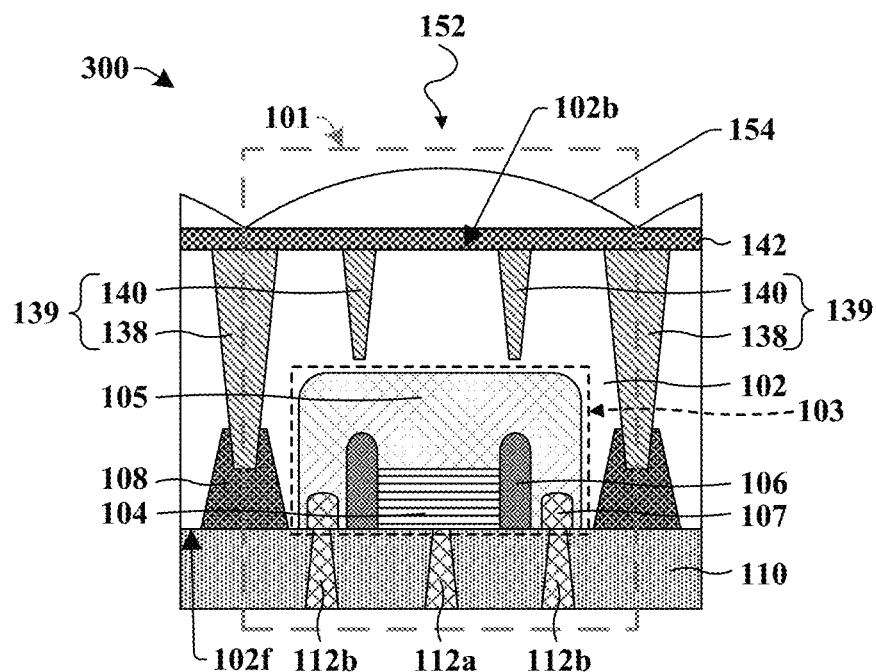
FIG. 3 illustrates a cross-sectional view of some embodiments of an image sensor comprising a dual trench isolation structure in which the image sensor is back-side illuminated (BSI).

FIG. 3 illustrates a cross-sectional view 300 of some embodiments of an image sensor comprising a dual trench isolation structure 139 in which the image sensor is backside illuminated (BSI).

In such embodiments, the image sensor comprises a photodetector 103 along the front side 102*f* of the substrate 102. The photodetector 103 may comprise a semiconductor well 105 in the substrate 102. The first semiconductor region 104 and the guard ring 106 may be disposed in the semiconductor well 105. The semiconductor well 105 may laterally surround the first semiconductor region 104 and the guard ring 106. In addition, a contact region 107 may be disposed in the semiconductor well 105 and may laterally surround the guard ring 106. The image sensor may further comprise a micro-lens 154 over the back side 102b of the substrate 102, through which a photon 152 may enter the image sensor.

In some embodiments, the substrate 102 may comprise a first doping type and the semiconductor well 105 may comprise a second doping type opposite the first doping type. In addition, the first semiconductor region 104 and the guard ring 106 may comprise the first doping type and the contact region 107 may comprise the second doping type. For example, the contact region 107 may define an anode of the photodetector 103, while the first semiconductor region 104 may define a cathode of the photodetector 103, or vice versa.

In addition, a first contact 112a extends through a first dielectric layer 110 to the first semiconductor region 104 and second contacts 112b extend through the first dielectric layer 110 to the contact region 107.

In some embodiments, a color filter (not shown) and a composite metal grid (CMG) structure (not shown) may be over the ARC layer 142 between the ARC layer 142 and the micro-lens 154.

Figure 4:
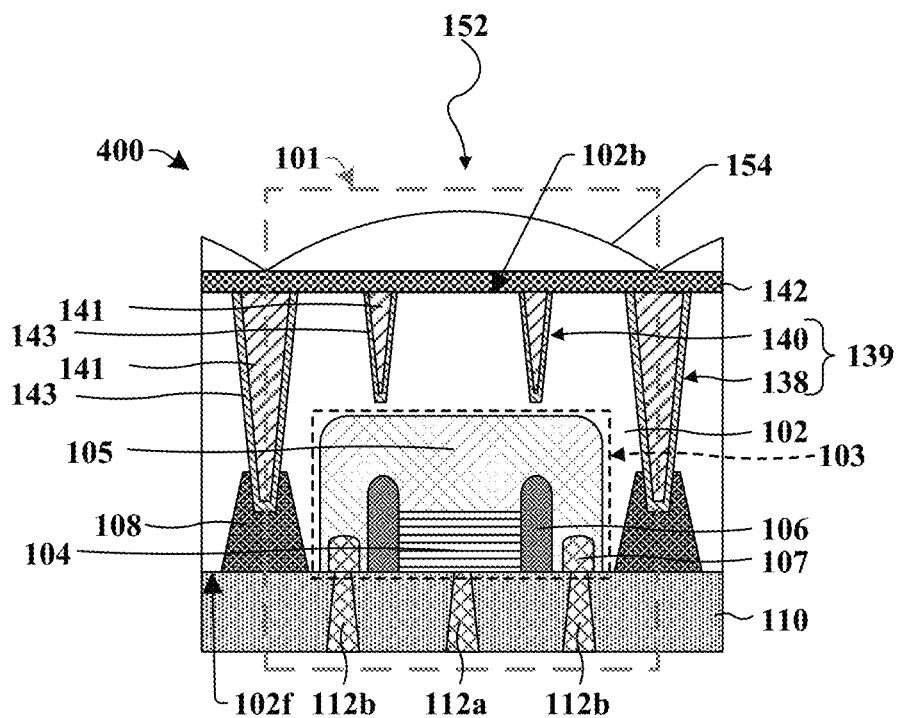
FIG. 4 illustrates a cross-sectional view of some embodiments of an image sensor comprising a dual trench isolation structure in which the dual trench isolation structure comprises two or more layers.

FIG. 4 illustrates a cross-sectional view 400 of some embodiments of an image sensor comprising a dual trench isolation structure 139 in which the dual trench isolation structure comprises two or more layers.

In such embodiments, the outer isolation structure 138 and the inner isolation structure 140 comprise a first isolation layer 141 and a second isolation layer 143 different from the first isolation layer 141. The second isolation layer 143 may be disposed along sidewalls and a lower surface of the first isolation layer 141. The second isolation layer 143 may laterally surround the first isolation layer 141 such that the second isolation layer 143 separates the first isolation layer 141 from the substrate 102.

The first isolation layer 141 may, for example, comprise silicon dioxide, silicon nitride, some other dielectric, tungsten, copper, cobalt, titanium, some other metal, or any combination of the foregoing. The second isolation layer 143 may, for example, comprise silicon dioxide, silicon nitride, hafnium oxide, zinc oxide, aluminum oxide, some other dielectric, or any combination of the foregoing.

Figure 5:
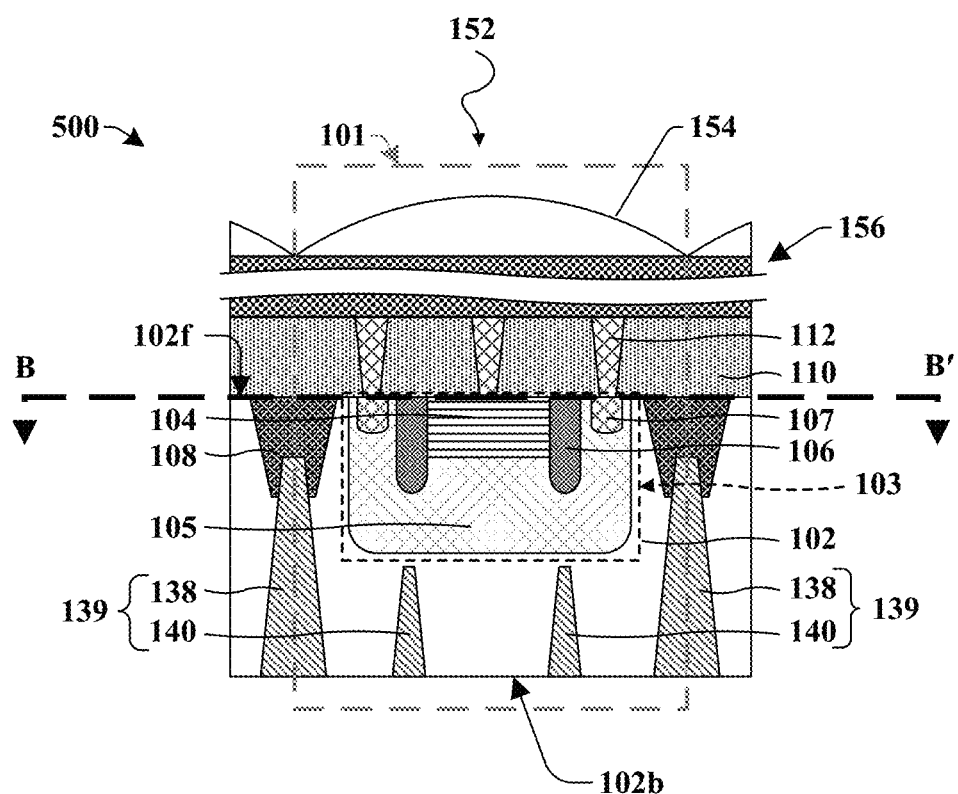
FIG. 5 illustrates a cross-sectional view of some embodiments of an image sensor comprising a dual trench isolation structure in which the image sensor is front-side illuminated (FSI).

FIG. 5 illustrates a cross-sectional view 500 of some embodiments of an image sensor comprising a dual trench isolation structure 139 in which the image sensor is front-side illuminated (FSI). The cross-sectional view 500 may be taken along line B-B' of FIG. 6.

In such embodiments, the image sensor comprises a photodetector 103 disposed along a front side 102f of a substrate 102. The dual trench isolation structure 139 comprises an inner isolation structure 140 and an outer isolation structure 138 that extend into the substrate 102 from a back side 102b of the substrate 102. The inner isolation structure 140 may be below the photodetector 103. For example, the inner isolation structure 140 may be directly below a guard ring 106 or between inner sidewalls of the guard ring 106. Contacts 112 may be disposed in a first dielectric layer 110 and over the photodetector 103. An interconnect structure 156 may be over the contacts 112. The interconnect structure 156 may, for example, comprise one or more metal lines, one or more vias, and one or more dielectric layers. Further, a micro-lens 154 may be over the interconnect structure 156.

Figure 6:
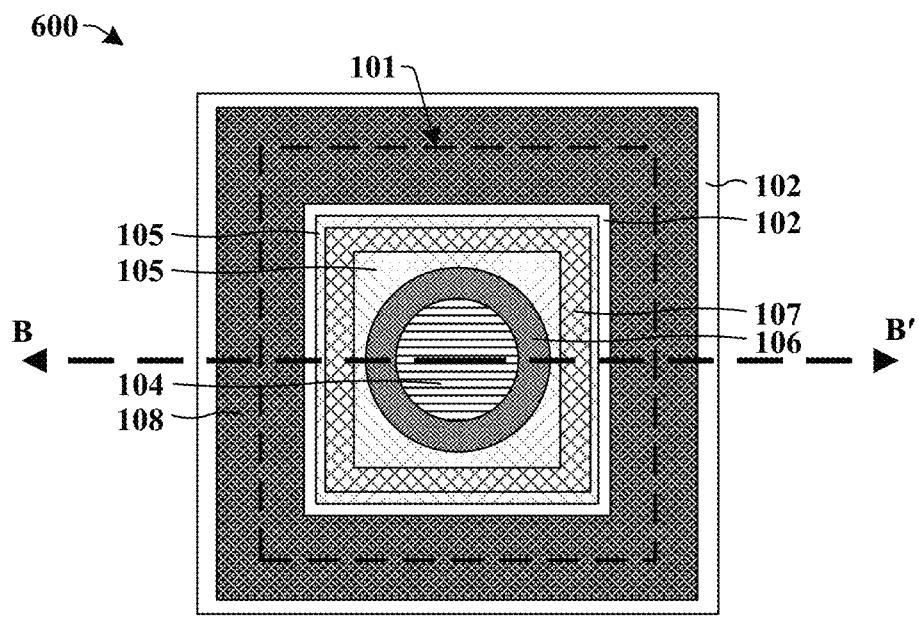
FIG. 6 illustrates a top layout view of some embodiments of the image sensor of FIG. 5.

FIG. 6 illustrates a top layout view 600 of some additional embodiments of the image sensor of FIG. 5.

In some embodiments, the STI structure 108 surrounds the photodetector 103 along a boundary of the pixel 101. The contact region 107 may surround the guard ring 106 and the guard ring 106 may surround the first semiconductor region 104. While FIG. 6 illustrates a single pixel 101 of the image sensor, it will be appreciated that the image sensor may include another number of the pixels along the substrate 102.

Figure 7:
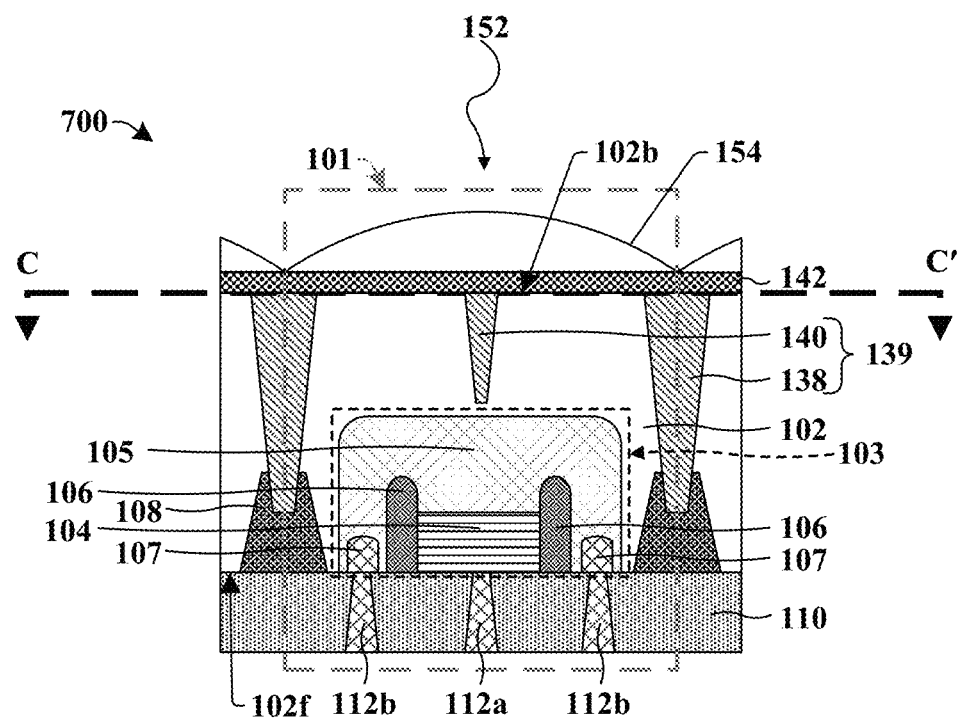
FIG. 7 illustrates a cross-sectional view of some embodiments of an image sensor comprising a dual trench isolation structure in which an inner isolation structure extends between inner sidewalls of a guard ring.

FIG. 7 illustrates a cross-sectional view 700 of some embodiments of an image sensor comprising a dual trench isolation structure 139 in which an inner isolation structure 140 extends between inner sidewalls of a guard ring 106. The cross-sectional view 700 may, for example, be taken along line C-C' of FIG. 8.

In such embodiments, the inner isolation structure 140 may be formed directly over the first semiconductor region 104 and between inner sidewalls of the guard ring 106.

By disposing the dual trench isolation structure 139 in the substrate 102 such that the inner isolation structure 140 is over the photodetector 103 and is between inner sidewalls of the guard ring 106, photons 152 entering the substrate 102 may collide with the inner isolation structure 140. In turn, the photons 152 may experience increased diffraction, refraction, and/or reflection in the substrate 102. This may increase the number of times the photons 152 pass across the photodetector 103 and may hence increase the likelihood of absorption by the photodetector 103. As a result, the QE of the image sensor may be increased, thereby increasing the performance of the image sensor and the integrated chip.

Figure 8:
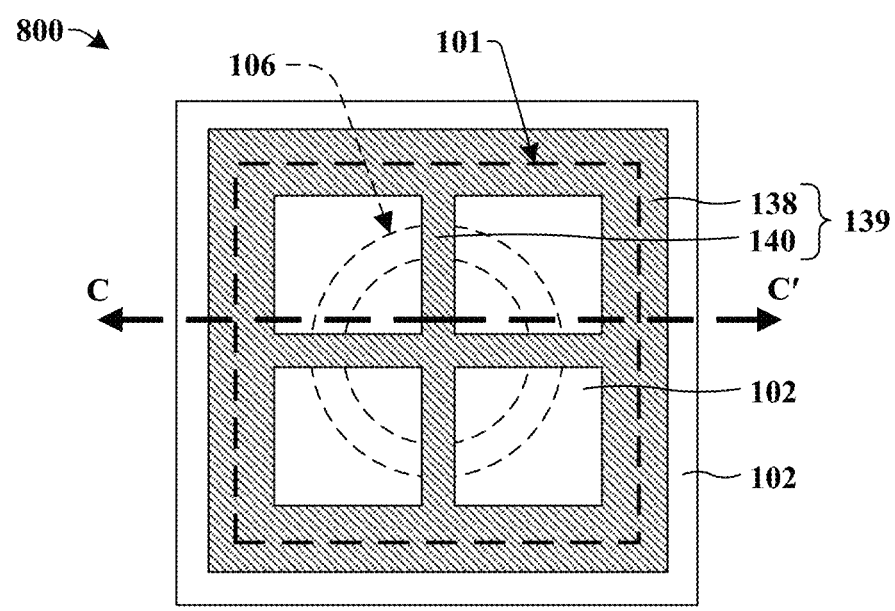
FIG. 8 illustrates a top layout view of some embodiments of the image sensor of FIG. 7.

FIG. 8 illustrates a top layout view 800 of some additional embodiments of the image sensor of FIG. 7.

The inner isolation structure 140 may have a cross-shaped top layout. In addition, the inner isolation structure 140 may extend from between inner sidewalls of the guard ring 106 to directly over a top of the guard ring 106 and may further extend beyond outer sidewalls of the guard ring 106.

Figure 9:
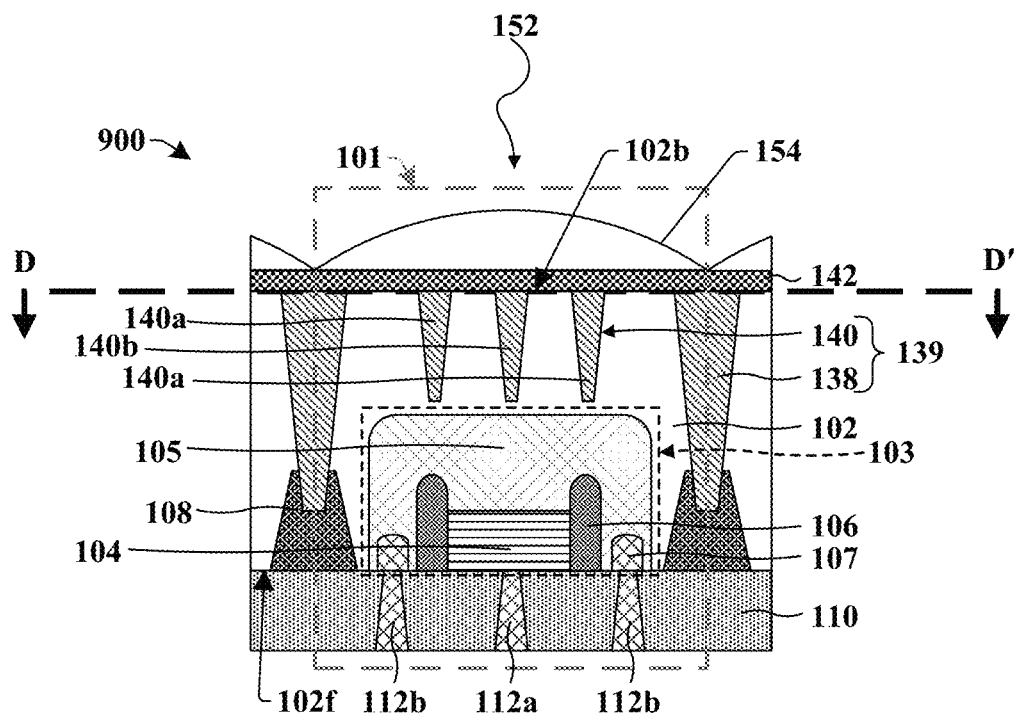
FIG. 9 illustrates a cross-sectional view of some embodiments of an image sensor comprising a dual trench isolation structure in which the dual trench isolation structure comprises a first inner isolation segment and a second inner isolation segment.

FIG. 9 illustrates a cross-sectional view 900 of some embodiments of an image sensor comprising a dual trench isolation structure 139 in which the dual trench isolation structure 139 comprises a first inner isolation segment 140a and a second inner isolation segment 140b. The cross-sectional view 900 may, for example, be taken along line D-D' of FIG. 10.

The inner isolation structure 140 comprises a first inner isolation segment 140a and a second inner isolation segment 140b between inner sidewalls of the first inner isolation segment 140a. The first inner isolation segment 140a may be laterally spaced apart from the second inner isolation segment 140b by the substrate 102. The first inner isolation segment 140a is directly over a top of the guard ring 106. The second inner isolation segment 140b is directly over a top of the first semiconductor region 104 and between inner sidewalls of the guard ring 106. The first inner isolation segment 140a may laterally surround the second inner isolation segment 140b.

Further, the first inner isolation segment 140a may extend into the substrate 102 to a first depth (not labeled) and the second inner isolation segment 140b may extend into the substrate 102 to a second depth (not labeled) that may be greater than, less than, or equal the first depth. Furthermore, the first inner isolation segment 140a may have a first width (not labeled) and the second inner isolation segment 140b may have a second width (not labeled) that is greater than, less than, or equal to the first width.

Figure 10:
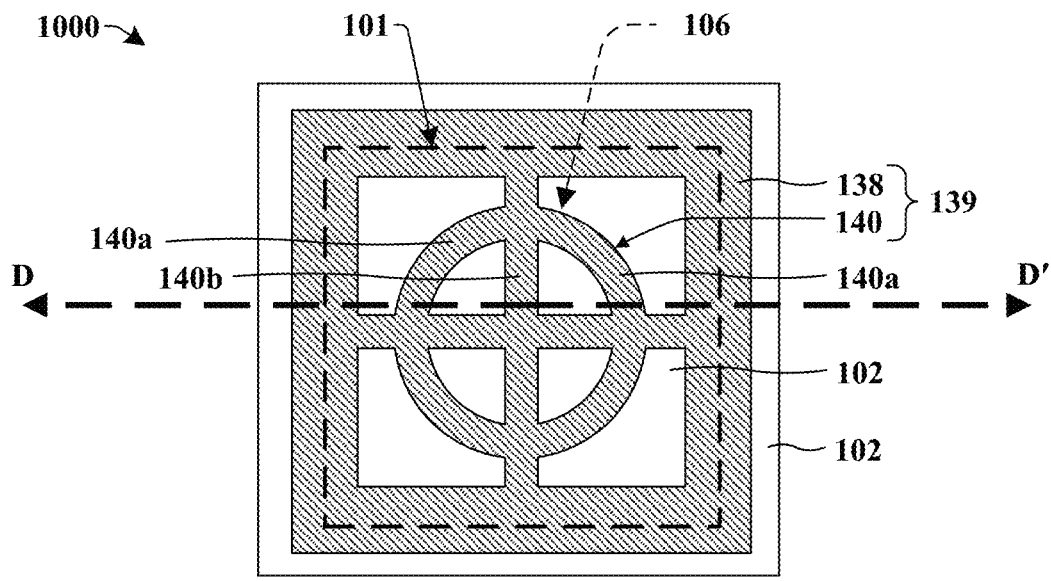
FIG. 10 illustrates a top layout view of some embodiments of the image sensor of FIG. 9.

FIG. 10 illustrates a top layout view 1000 of some additional embodiments of the image sensor of FIG. 9.

In such embodiments, the first inner isolation segment 140a may have approximately the same top layout as the guard ring 106 and may surround a center of the pixel 101 in a ring shape while the second inner isolation segment 140b may extend over the center of the pixel 101 in a cross shape.

Figure 11:
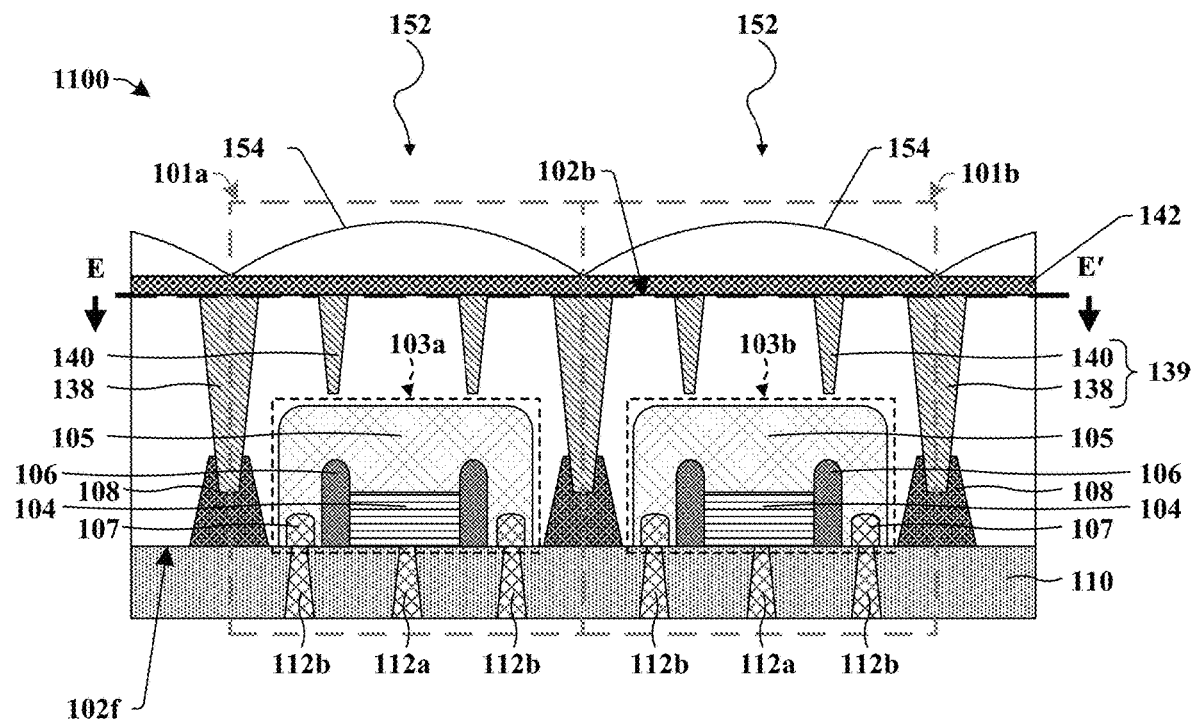
FIG. 11 illustrates a cross-sectional view of some embodiments of an image sensor including two pixels each comprising a dual trench isolation structure.

FIG. 11 illustrates a cross-sectional view 1100 of some embodiments of an image sensor including two pixels (e.g., 101a, 101b) each comprising a dual trench isolation structure 139. The cross-sectional view 1100 may be taken along line E-E' of FIG. 12.

In such embodiments, the image sensor comprises a first pixel 101a and a second pixel 101b (i.e., a neighboring pixel) adjacent to the first pixel 101a. The first pixel 101a may comprise a first photodetector 103a and the second pixel 101b may comprise a second photodetector 103b (i.e., a neighboring photodetector). The outer isolation structure 138 and the STI structure 108 may laterally separate the first pixel 101a from the second pixel 101b along a boundary between the first pixel 101a and the second pixel 101b (and thus laterally separate the first photodetector 103a from the second photodetector 103b).

Figure 12:
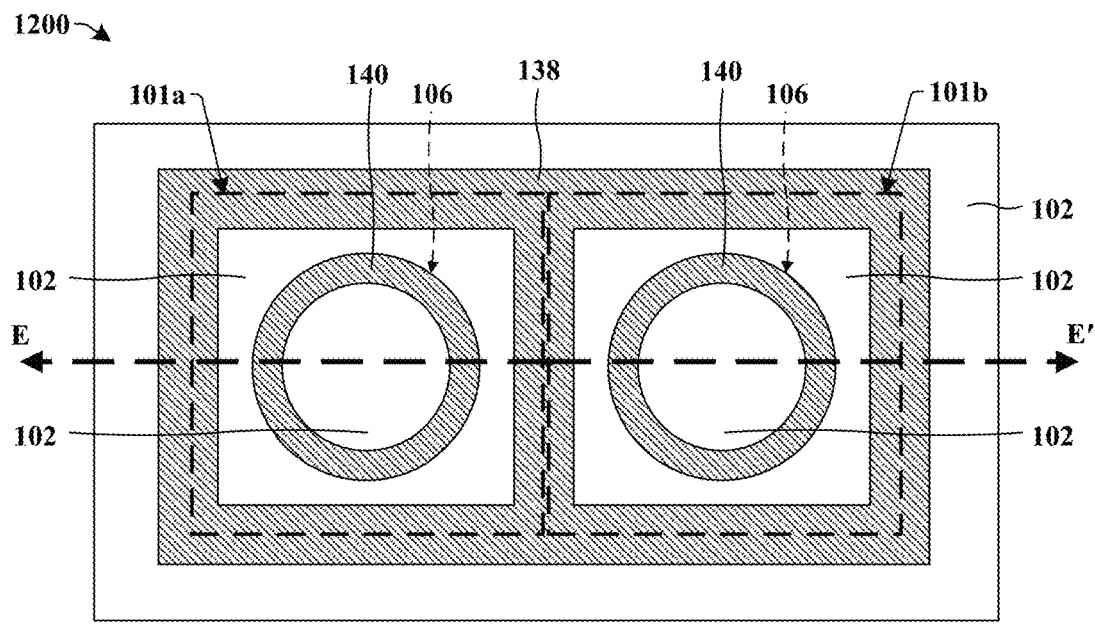
FIG. 12 illustrates a top layout view of some embodiments of the image sensor of FIG. 11.

FIG. 12 illustrates a top layout view 1200 of some additional embodiments of the image sensor of FIG. 11.

The image sensor may comprise, for example, a one by two pixel array. The outer isolation structure 138 may laterally surround both the first pixel 101a and the second pixel 101b and may laterally separate the first pixel 101a and the second pixel 101b. While FIG. 12 illustrates the image sensor comprising a one by two pixel array, it will be appreciated that pixel arrays of different sizes and/or dimensions may also be used.

Figure 13:
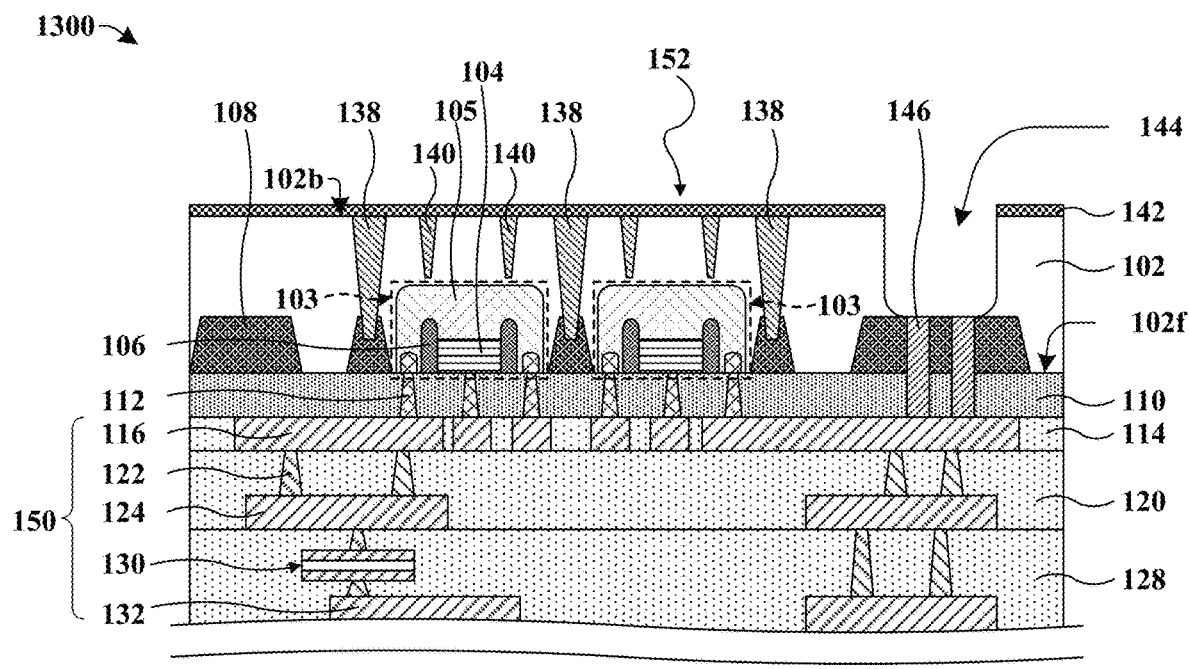
FIG. 13 illustrates a cross-sectional view of some additional embodiments of an integrated chip including an image sensor, the image sensor comprising a dual trench isolation structure.

FIG. 13 illustrates a cross-sectional view 1300 of some additional embodiments of an integrated chip including an image sensor, the image sensor comprising a dual trench isolation structure.

The integrated chip comprises one or more photodetectors 103 in a substrate 102, one or more metal lines along a front side 102f of the substrate 102, and one or more dual trench isolation structures over overlying and surrounding the photodetectors 103. For example, the integrated chip may comprise two photodetectors 103 comprising semiconductor wells 105, first semiconductor regions 104 in the semiconductor wells 105, and guard rings 106 in the semiconductor wells 105 and surrounding the first semiconductor regions 104.

A plurality of contacts 112 may extend through a first dielectric layer 110 to the photodetectors 103. An interconnect structure 150 comprising a plurality of metal lines (e.g., 116, 124, 132), a plurality of vias (e.g., 122), and one or more metal-insulator-metal (MIM) capacitors (e.g., 130) may be below the contacts 112 and in a plurality of additional dielectric layers (e.g., 114, 120, 128).

Further, a plurality of STI structures 108 may be disposed in the substrate 102 along the front side 102f of the substrate 102 and between the photodetectors 103. An ARC layer 142 may also be disposed along a back side 102b of the substrate and a pad structure 146 may be disposed along a peripheral portion of the integrated chip and beneath a pad opening 144.

In some embodiments, the dual trench isolation structure comprises one or more outer isolation structures 138 that extend through the substrate from the back side 102b of the substrate 102 to underlying STI structures 108. The dual trench isolation structure further comprises one or more inner isolation structures 140 over the photodetectors 103. The inner isolation structures 140 may be directly over the guard rings 106, as illustrated in FIG. 13, and/or between inner sidewalls of the guard rings 106, as illustrated in FIGS. 7 and 9.

FIGS. 14-22 illustrate cross-sectional views 1400-2200 of some embodiments of method for forming an integrated chip including an image sensor, the image sensor comprising a dual trench isolation structure. Although FIGS. 14-22 are described in relation to a method, it will be appreciated that the structures disclosed in FIGS. 14-22 are not limited to such a method, but instead may stand alone as structures independent of the method.

Figure 14:
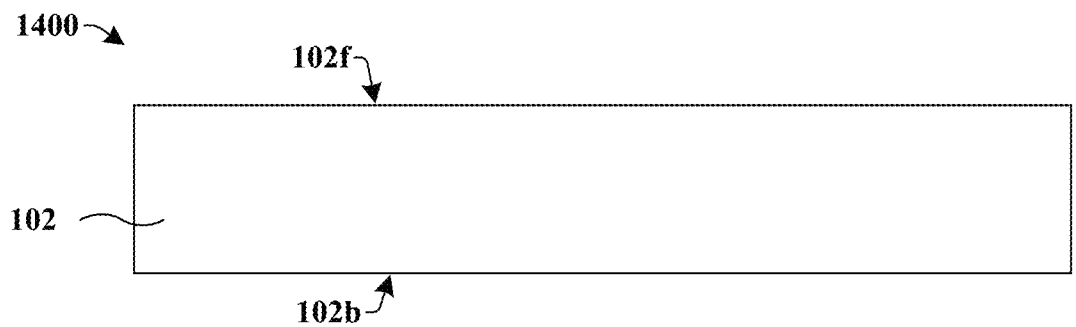
FIGS. 14-22 illustrate cross-sectional views of some embodiments of a method for forming an integrated chip including an image sensor, the image sensor comprising a dual trench isolation structure.

As shown in cross-sectional view 1400 of FIG. 14, a substrate 102 is provided. The substrate 102 comprises a front side 102f and a back side 102b opposite the front side 102f.

Figure 15:
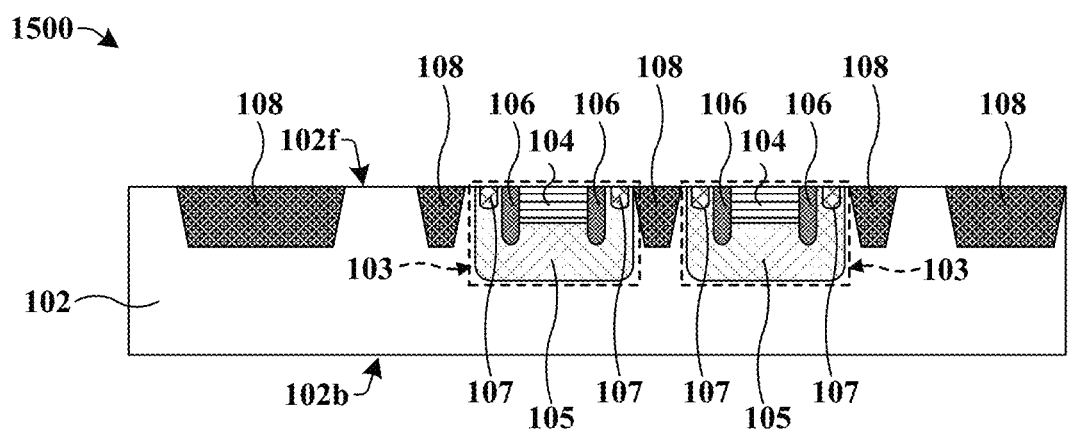

As shown in cross-sectional view 1500 of FIG. 15, one or more photodetectors 103 may be formed in the substrate 102. For example, one or more semiconductor wells 105 may be formed in the substrate 102, one or more first semiconductor regions 104 and one or more contact regions 107 may be formed in the semiconductor wells 105, and one or more guard rings 106 may be formed in the semiconductor wells 105 and along sidewalls of the first semiconductor regions 104. The guard ring(s) 106 may, for example, have a top layout as in any one of FIGS. 2A-2C or some other suitable top layout. Any of the semiconductor wells 105, the first semiconductor regions 104, the contact regions 107, and the guard rings 106 may, for example, be formed by ion implantation or another suitable process.

In addition, one or more STI structures 108 may be formed in the front side 102f of the substrate 102. The STI structures 108 may, for example, be formed by performing one or more etches to form STI openings in the front side 102f of the substrate 102 and subsequently depositing an isolation material in the STI openings by chemical vapor deposition (CVD), physical vapor deposition (PVD), atomic layer deposition (ALD), a spin on process, some other suitable deposition process, or any combination of the foregoing.

Figure 16:
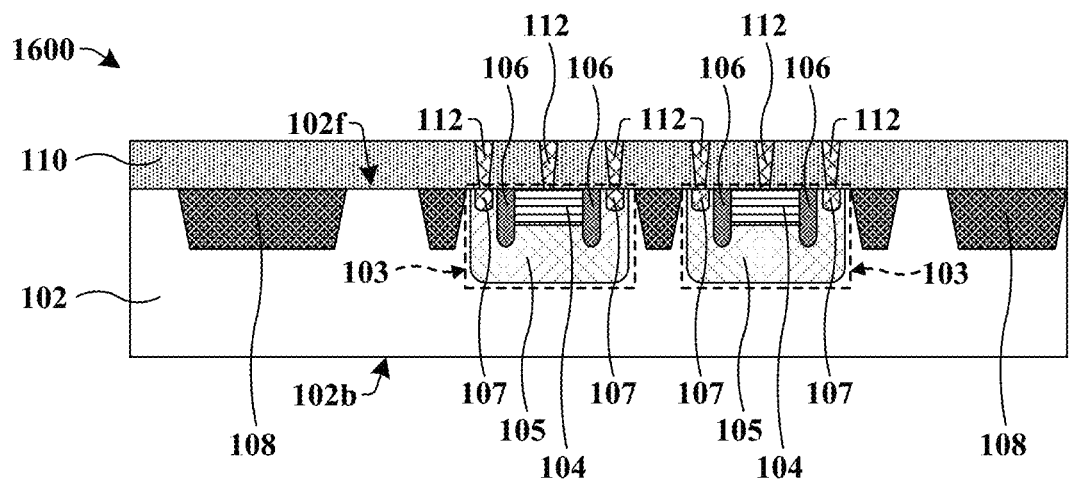

As shown in cross-sectional view 1600 of FIG. 16, a first dielectric layer 110 may be formed along the front side 102f of the substrate 102 over the STI structures 108 and the photodetectors 103. The first dielectric layer 110 may, for example, be formed by depositing a dielectric material along the front side 102f of the substrate 102 by CVD, PVD, ALD, a spin on process, some other suitable deposition process, or any combination of the foregoing.

In addition, one or more contacts 112 may be formed on the front side 102f of the substrate 102. The contacts 112 may extend through the first dielectric layer 110 to first semiconductor regions 104 and the contact regions 107. A process for forming the contacts 112 may, for example, comprise: etching the first dielectric layer 110 to form contact openings in the first dielectric layer 110; depositing a metal material in the contact openings; and performing a planarization into the metal material. Other suitable processes are, however, amenable. The etching may, for example, comprise a wet etching process, a dry etching process, or the like. The depositing may, for example, be performed by a sputtering process, an electroplating process, some other suitable deposition process, or any combination of the foregoing. The planarization may, for example, comprise a chemical mechanical planarization (CMP) process or the like.

Figure 17:
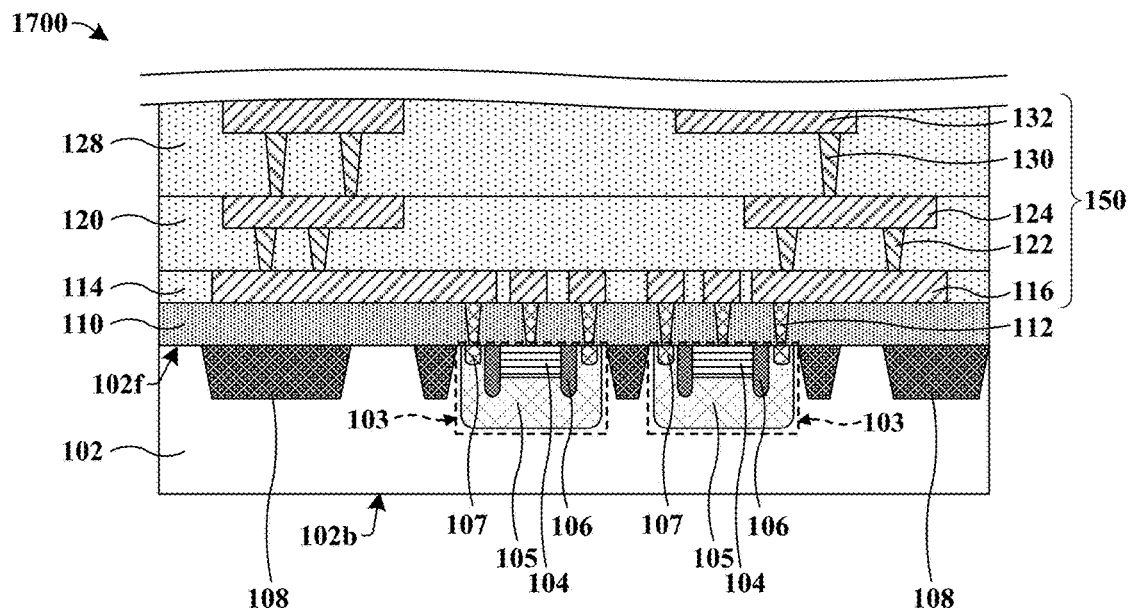

As shown in cross-sectional view 1700 of FIG. 17, an interconnect structure 150 comprising a plurality of metal lines and vias may be formed over first dielectric layer 110 and the contacts 112 and may be electrically connected to the photodetectors 103 through the contacts.

For example, one or more first metal lines 116, one or more first vias 122, one or more second metal lines 124, one or more second vias 130, and one or more third metal lines 132 may be formed over the first metal lines 116 and, may be formed in a second dielectric layer 114, a third dielectric layer 120, and a fourth dielectric layer 128. The dielectric layers (e.g., 114, 120, 128) may, for example be formed by depositing a dielectric material by CVD, PVD, ALD, a spin on process, some other suitable deposition process, or any combination of the foregoing. A process for forming the metal lines (e.g., 116, 124, 132) and the vias (e.g., 122, 130) may, for example, comprise etching the dielectric layers (e.g., 114, 120, 128) to form metal line openings and via openings in the dielectric layers; depositing metal materials in the metal line openings and in the via openings; and planarizing the metal materials. Other suitable processes are, however, amenable. The etching may, for example, comprise a wet etching process, a dry etching process, or the like. The depositing may, for example, be performed by a sputtering process, an electroplating process, some other suitable deposition process, or any combination of the foregoing. The planarization may, for example, comprise a CMP process or the like.

Figure 18:
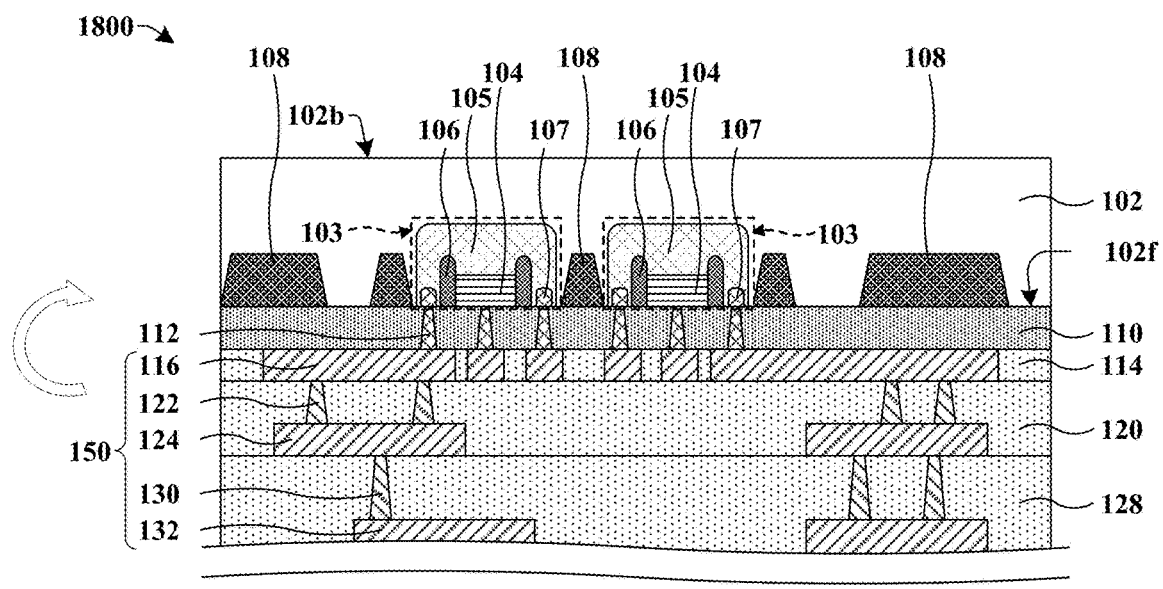

As shown in cross-sectional view 1800 of FIG. 18, the integrated chip may be rotated such that the back side 102b of the substrate 102 overlies the front side 102f of the substrate 102.

Figure 19:
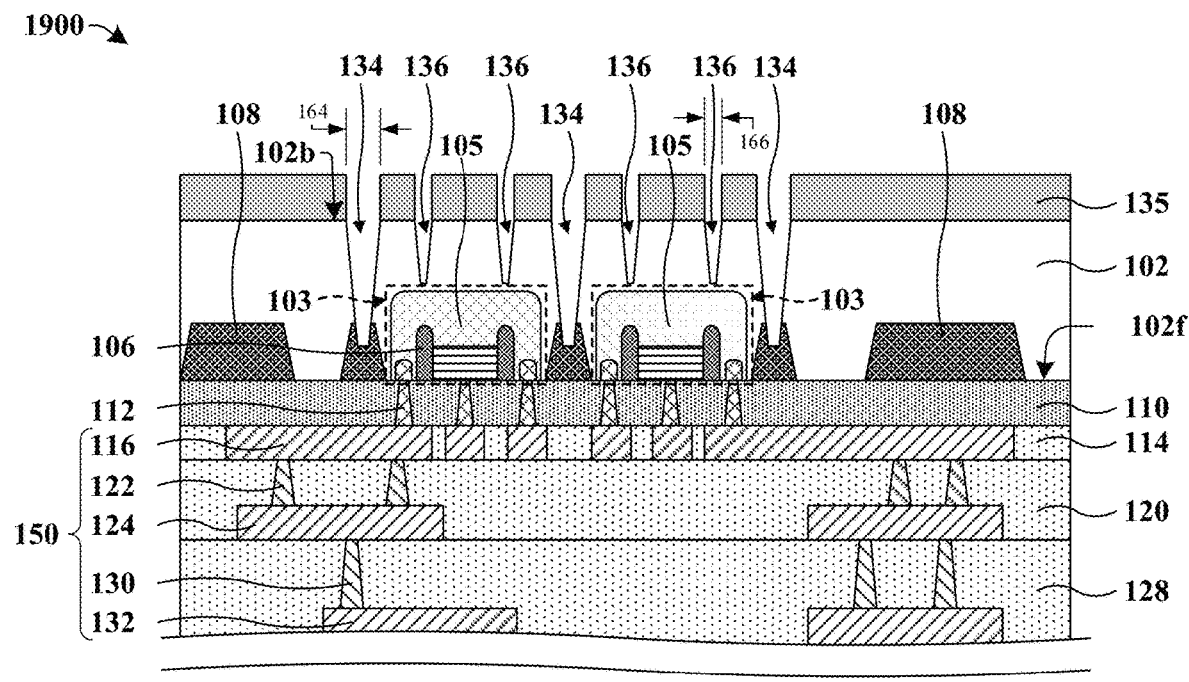

As shown in cross-sectional view 1900 of FIG. 19, a photoresist mask 135 may be formed along the back side 102b of the substrate 102. The back side 102b of the substrate 102 may then be etched with the photoresist mask 135 in place to form one or more outer isolation openings 134 and one or more inner isolation openings 136 in the back side 102b of the substrate 102.

A first width 164 of the outer isolation openings 134 is greater than a second width 166 of the inner isolation openings 136. The first width 164 may, for example, be about 0.2 micrometers, and/or the second width 166 may, for example, be about 0.05 to 0.2 micrometers. Other suitable dimensions are, however, amenable. Because the first width 164 is greater than the second width 166, an etchant used by the etching more readily interacts with the substrate 102 and hence the outer isolation openings 134 extend into the substrate 102 to a greater depth than the inner isolation openings 136. The etching may, for example, comprise a wet etching process, a dry etching process, or some other suitable etching process. The outer isolation openings 134 may extend through the substrate 102 from the back side 102b of the substrate 102 to the STI structures 108. Further, the inner isolation openings 136 may extend from the back side 102b of the substrate 102 to within the substrate 102 and over the semiconductor well 105.

Figure 20:
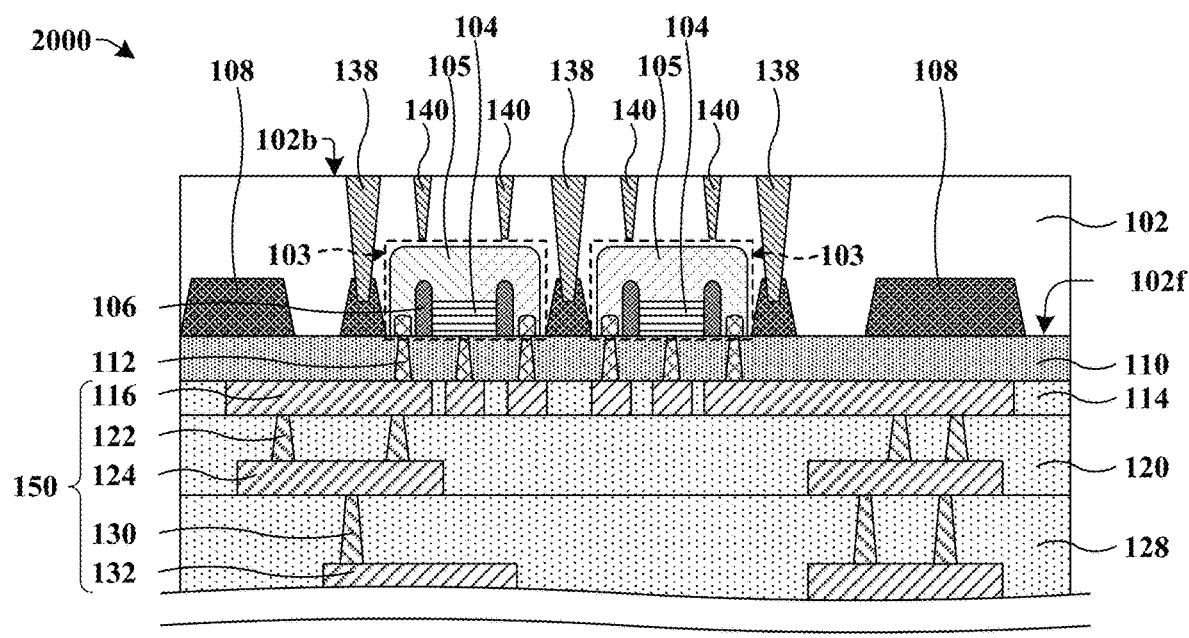

As shown in cross-sectional view 2000 of FIG. 20, one or more dual trench isolation structures may be formed in the isolation openings. For example, one or more outer isolation structures 138 and one or more inner isolation structures 140 may be formed in the outer isolation openings 134 and the inner isolation openings 136, respectively.

Forming the outer isolation structures 138 and the inner isolation structures 140 may, for example, comprise depositing one or more isolation materials in the outer isolation openings 134 and the inner isolation openings 136 and subsequently performing a planarization into the isolation materials. The depositing may, for example, be performed by CVD, PVD, ALD, a spin on process, a sputtering process, an electroplating process, some other suitable deposition process, or any combination of the foregoing. The planarization may, for example, comprise a CMP process or the like. Widths and/or top layouts of the outer isolation structures 138 and the inner isolation structures 140 may, for example, be equal to those of their associated openings (e.g., first width 164 and second width 166).

The outer isolation structures 138 and the inner isolation structures 140 may, for example, have a top layout as in any one of FIGS. 2A-2C or some other suitable top layout. However, in some alternative embodiments, the dual trench isolation structures may, for example, have inner isolation structures 140 that extend over the photodetectors 103, as in any of FIGS. 7-10.

Figure 21:
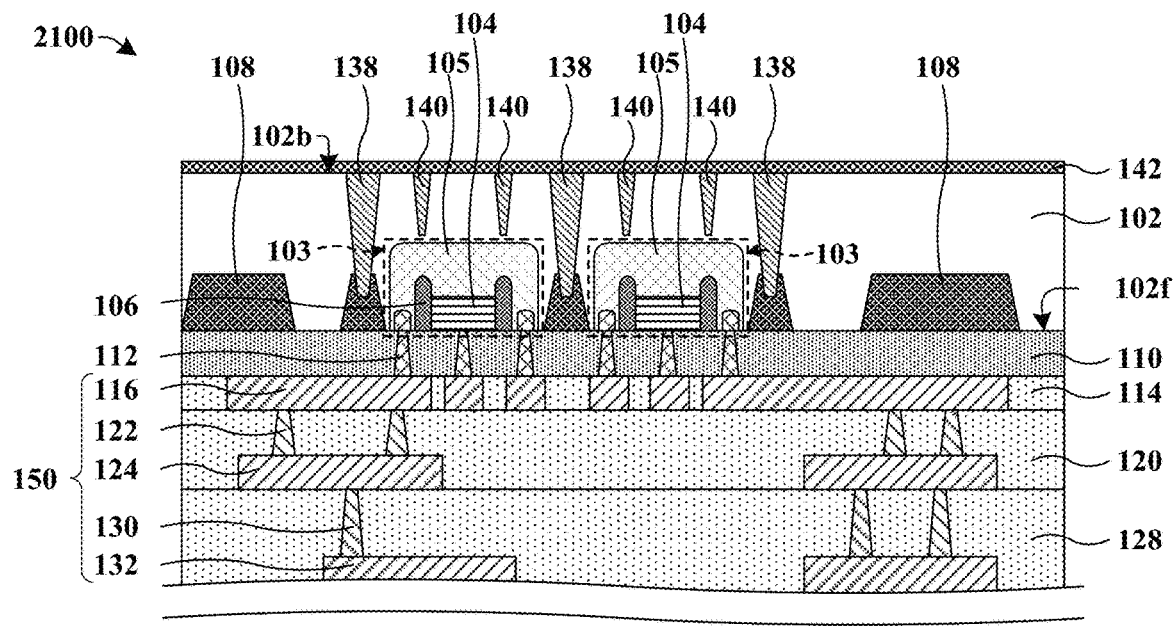

As shown in cross-sectional view 2100 of FIG. 21, an ARC layer 142 may be formed along the back side 102b of the substrate 102 and over the dual trench isolation structure. The ARC layer 142 may, for example, be formed by depositing an anti-reflective material by CVD, PVD, ALD, a spin on process, some other suitable deposition process, or any combination of the foregoing.

Figure 22:
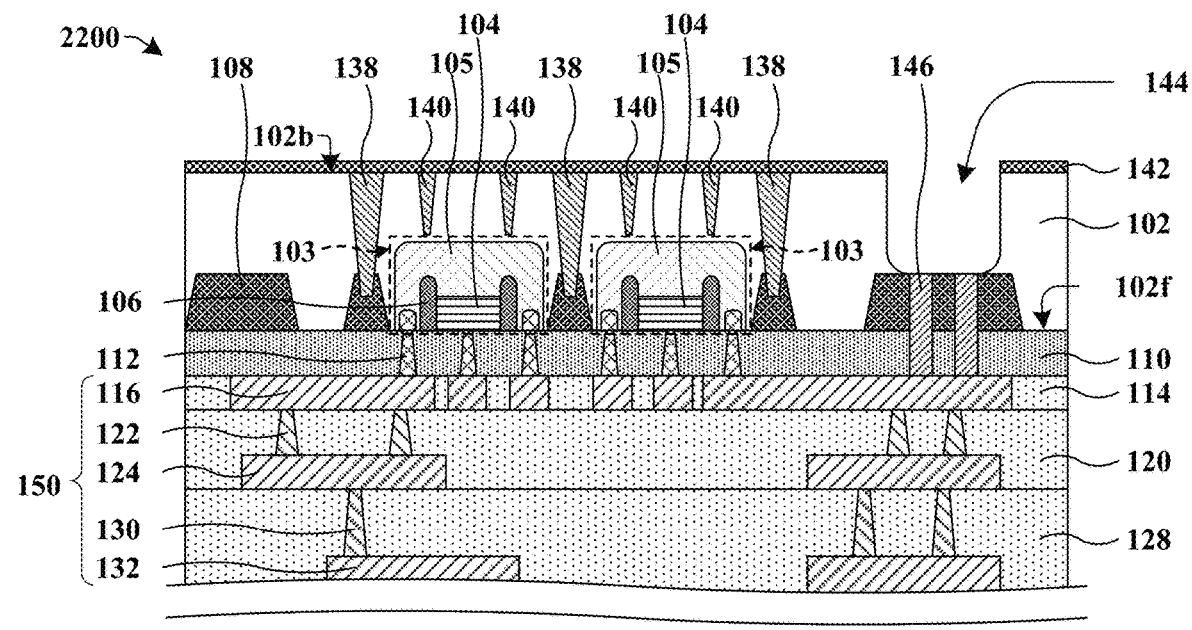

As shown in cross-sectional view 2200 of FIG. 22, a pad opening 144 may be formed in the back side 102b of the substrate 102. The pad opening 144 may be formed in a peripheral portion of the substrate 102 such that the pad opening 144 is laterally spaced apart from the photodetectors 103 and directly over one of the STI structures 108. The pad opening 144 may, for example, be formed by etching the back side 102b of the substrate 102 with a wet etching process, a dry etching process, or another suitable etching process.

In addition, a pad structure 146 may be formed beneath the pad opening 144 in the underlying STI structure 108. The pad structure 146 may extend through the underlying STI structure 108 and through the first dielectric layer 110 to one of the first metal lines 116. The pad structure 146 may, for example, be formed by etching the underlying STI structure 108 and the first dielectric layer 110 to form openings in the underlying STI structure 108 and the first dielectric layer 110 and subsequently depositing a metal material in the openings by a sputtering process, an electroplating process, some other suitable deposition process, or any combination of the foregoing.

In general, implementing the dual trench isolation structure in the image sensor may be a relatively simple and/or inexpensive process compared to implementing a HA structure. Thus, a cost of producing the image sensor may be reduced. However, it will be appreciated that in some embodiments (not shown), a HA structure may also be implemented in addition to the dual trench isolation structure to further improve a performance of the image sensor. Further, by forming the dual trench isolation structures in the substrate 102 such that the inner isolation structures 140 are over the photodetectors 103, photons entering the substrate 102 may collide with the inner isolation structures 140 and experience increased diffraction, refraction, and/or reflection in the substrate 102. This may increase the number of times the photons pass across the photodetector 103 and may hence increase the likelihood of absorption by the photodetector 103. As a result, the QE of the image sensor may be increased, thereby increasing the performance of the image sensor and the integrated chip.

In addition, the method may further comprise forming one or more micro-lenses (not shown) along the back side 102b of the substrate 102, through which photons may enter the substrate 102, such that the image sensor may be back-side illuminated. Alternatively, the method may further comprise forming one or more micro-lenses (not shown) along the front side 102f of the substrate 102, through which photons may enter the substrate 102, such that the image sensor may be front-side illuminated.

Figure 23:
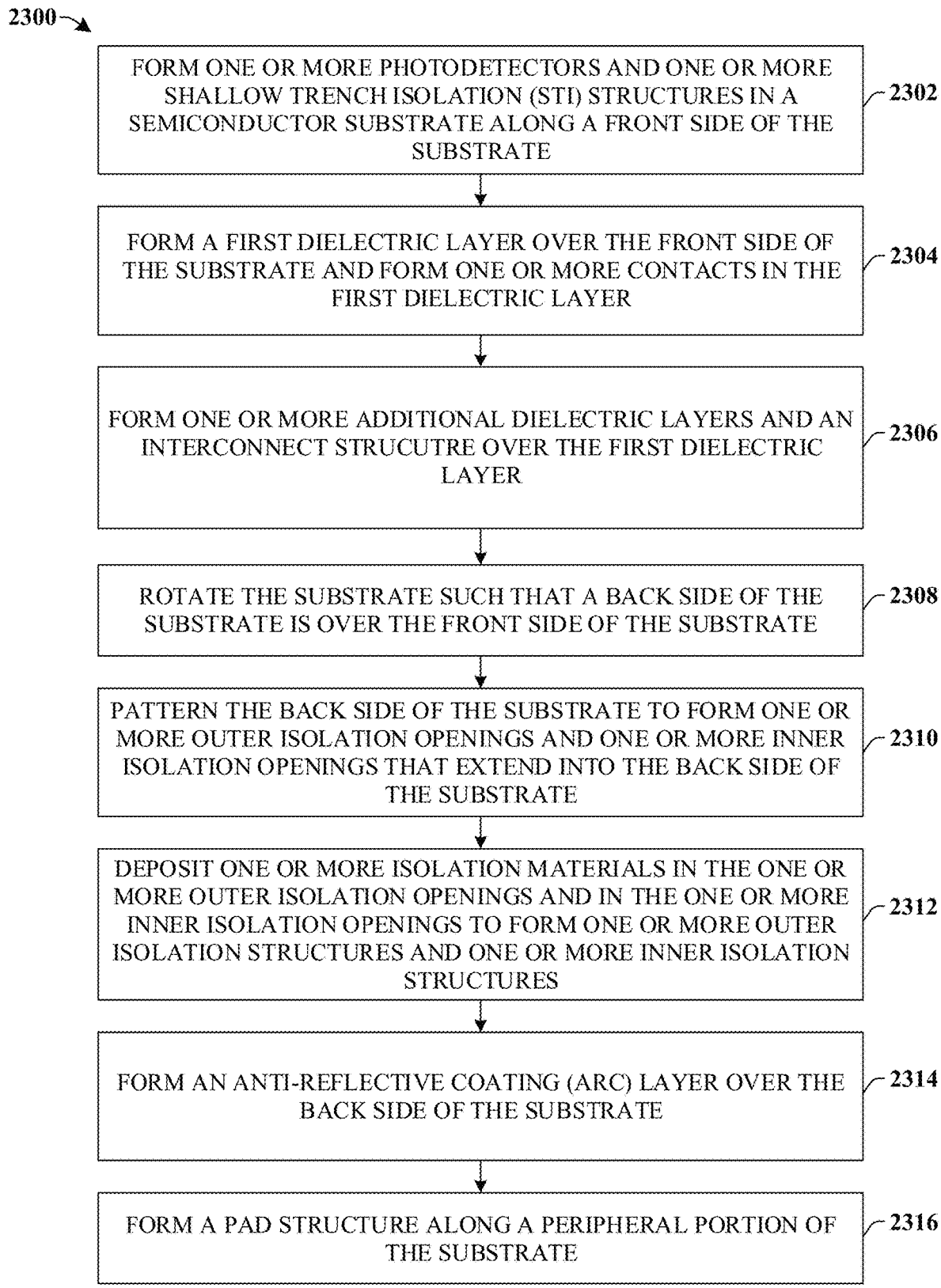
FIG. 23 illustrates a flow diagram of some embodiments of a method for forming an integrated chip including an image sensor, the image sensor comprising a dual trench isolation structure.

FIG. 23 illustrates a flow diagram of some embodiments of a method 2300 of forming an integrated chip including an image sensor, the image sensor comprising a dual trench isolation structure. While method 2300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2302, one or more photodetectors and one or more shallow trench isolation (STI) structures are formed in a substrate along a front side of the substrate. FIG. 15 illustrates a cross-sectional view 1500 of some embodiments corresponding to act 2302.

At 2304, a first dielectric layer is formed over the front side of the substrate and one or more contacts are formed in the first dielectric layer. FIG. 16 illustrates a cross-sectional view 1600 of some embodiments corresponding to act 2304.

At 2306, one or more additional dielectric layers and an interconnect structure are formed over the first dielectric layer. FIG. 17 illustrates a cross-sectional view 1700 of some embodiments corresponding to act 2306.

At 2308, the substrate is rotated such that a back side of the substrate is over the front side of the substrate. FIG. 18 illustrates a cross-sectional view 1800 of some embodiments corresponding to act 2308.

At 2310, the back side of the substrate is patterned to form one or more outer isolation openings and one or more inner isolation openings that extend into the back side of the substrate. FIG. 19 illustrates a cross-sectional view 1900 of some embodiments corresponding to act 2310.

At 2312, one or more isolation materials are deposited in the one or more outer isolation openings and in the one or more inner isolation openings to form one or more outer isolation structures and one or more inner isolation structures. FIG. 20 illustrates a cross-sectional view 2000 of some embodiments corresponding to act 2312.

At 2314, an ARC layer is formed over the back side of the substrate. FIG. 21 illustrates a cross-sectional view 2100 of some embodiments corresponding to act 2314.

At 2316, a pad structure is formed along a peripheral portion of the substrate. FIG. 22 illustrates a cross-sectional view 2200 of some embodiments corresponding to act 2316.

Thus, various embodiments of the present disclosure are directed toward an integrated chip including an image sensor, the image sensor comprising a dual trench isolation structure for improving the QE of the image sensor while reducing the cost and complexity of forming the image sensor.

Accordingly, in some embodiments, the present disclosure relates to an image sensor comprising a substrate. A photodetector is in the substrate and comprises a semiconductor guard ring extending into a first side of the substrate. A shallow trench isolation (STI) structure extends into the first side of the substrate. An outer isolation structure extends into a second side of the substrate, opposite the first side of the substrate, to the STI structure. The STI structure and the outer isolation structure laterally surround the photodetector. An inner isolation structure extends into the second side of the substrate and overlies the photodetector. The inner isolation structure is vertically separated from the photodetector by the substrate. Further, the outer isolation structure laterally surrounds the inner isolation structure.

In other embodiments, the present disclosure relates to an integrated chip comprising a semiconductor substrate. A pixel is on a first side of the semiconductor substrate and comprises a photodetector in the semiconductor substrate. The photodetector comprises a first semiconductor region, a second semiconductor region, and a guard ring. The first semiconductor region and the guard ring have an opposite doping type as the second semiconductor region and extend into the second semiconductor region from the first side. The guard ring separates a sidewall of the first semiconductor region from the second semiconductor region. A dual trench isolation structure extends into a second side of the semiconductor substrate, opposite the first side of the semiconductor substrate, and comprises an outer isolation structure and an inner isolation structure. The outer isolation structure laterally surrounds the pixel along a boundary of the pixel and extends into the semiconductor substrate to a first depth. Further, the inner isolation structure overlies the photodetector and extends into the semiconductor substrate to a second depth less than the first depth.

In yet other embodiments, the present disclosure relates to a method for forming an image sensor. The method comprises forming a pixel on a first side of a substrate. The pixel comprises a photodetector in the substrate and the photodetector comprises a guard ring extending into the first side of the substrate. An interconnect structure electrically coupled to the pixel is formed on the first side of the substrate. A second side of the substrate opposite the first side of the substrate is patterned to form an outer isolation opening and an inner isolation opening. The outer isolation opening extends into the substrate to a first depth and laterally surrounds the pixel along a boundary of the pixel. The inner isolation opening extends into the substrate to a second depth less than the first depth and overlies the photodetector. Further, a first dielectric layer is deposited in the outer isolation opening and the inner isolation opening to form a dual trench isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising:
   a substrate;
   a photodetector in the substrate, the photodetector comprising a semiconductor guard ring along a first side of the substrate;
   a shallow trench isolation (STI) structure extending into the substrate from the first side of the substrate;
   an outer isolation structure extending into the substrate from a second side of the substrate, opposite the first side of the substrate, to the STI structure, wherein the STI structure and the outer isolation structure laterally surround the photodetector; and
   an inner isolation structure over the photodetector and extending into the substrate from the second side of the substrate, wherein the inner isolation structure is vertically separated from the photodetector by the substrate and has a ring-shaped top layout, and wherein the outer isolation structure laterally surrounds the inner isolation structure.

2. The image sensor of claim 1, wherein the outer isolation structure has a lower surface disposed at a first depth as measured from the second side of the substrate, wherein the inner isolation structure has a lower surface disposed at a second depth as measured from the second side of the substrate, and wherein the first depth is greater than the second depth.

3. The image sensor of claim 2, wherein the first depth is about 2.5 to 6 micrometers, wherein the second depth is less than about 2 micrometers or less than about 5.5 micrometers, and wherein a lateral distance between the outer isolation structure and the inner isolation structure is about 0.2 to 2.2 micrometers.

4. The image sensor of claim 1, wherein the inner isolation structure is directly over the semiconductor guard ring and is vertically separated from the semiconductor guard ring by the substrate.

5. The image sensor of claim 1, wherein the inner isolation structure surrounds a center of the photodetector in a first closed path, and wherein the semiconductor guard ring surrounds the center of the photodetector along the first closed path.

6. The image sensor of claim 1, wherein a bottom surface of the inner isolation structure is directly over the photodetector.

7. An integrated chip comprising:
a semiconductor substrate;
a pixel along a first side of the semiconductor substrate, the pixel comprising a photodetector in the semiconductor substrate, the photodetector comprising a first semiconductor region, a second semiconductor region, and a guard ring, wherein the first semiconductor region and the guard ring have an opposite doping type as the second semiconductor region, wherein the first semiconductor region and the guard ring extend into the second semiconductor region from the first side of the semiconductor substrate, and wherein the guard ring separates a side of the first semiconductor region from the second semiconductor region; and
a dual trench isolation structure extending into the semiconductor substrate from a second side of the semiconductor substrate, opposite the first side of the semiconductor substrate, the dual trench isolation structure comprising an outer isolation structure and an inner isolation structure, wherein the outer isolation structure laterally surrounds the pixel along a boundary of the pixel and extends into the semiconductor substrate to a first depth, and wherein a bottom surface of the inner isolation structure is over the photodetector and the inner isolation structure extends into the semiconductor substrate to a second depth, different than the first depth.

8. The integrated chip of claim 7, wherein the inner isolation structure is directly over the guard ring and is vertically separated from the guard ring by the semiconductor substrate.

9. The integrated chip of claim 7, wherein the inner isolation structure has a ring-shaped top layout.

10. The integrated chip of claim 7, wherein the bottom surface of the inner isolation structure is directly over the guard ring.

11. The integrated chip of claim 7, further comprising:
a neighboring photodetector laterally separated from the photodetector by the outer isolation structure; and
a neighboring inner isolation structure directly over the neighboring photodetector, wherein the outer isolation structure laterally surrounds both the inner isolation structure and the neighboring inner isolation structure.

12. The integrated chip of claim 7, wherein the inner isolation structure surrounds a portion of the semiconductor substrate in a closed path.

13. An integrated chip comprising:
a semiconductor substrate;
a photodetector comprising a guard ring along a first side of the semiconductor substrate, wherein the guard ring surrounds a center of the photodetector in a first closed path;
an outer trench isolation structure extending into the semiconductor substrate from a second side of the semiconductor substrate, opposite the first side, the outer trench isolation structure laterally surrounding the photodetector; and
an inner trench isolation structure comprising a metal extending into the semiconductor substrate from the second side of the semiconductor substrate, disposed directly over the photodetector, and vertically spaced from the photodetector, wherein the inner trench isolation structure surrounds the center of the photodetector along the first closed path.

14. The integrated chip of claim 13, wherein a bottom surface of the inner trench isolation structure is directly over the guard ring.

15. The integrated chip of claim 13, wherein the inner trench isolation structure is directly over the guard ring, the integrated chip further comprising:
a neighboring photodetector laterally spaced from the photodetector and comprising a neighboring guard ring; and
a neighboring inner trench isolation structure directly over the neighboring guard ring, wherein the outer trench isolation structure is directly between the photodetector and the neighboring photodetector, and the outer trench isolation structure is directly between the inner trench isolation structure and the neighboring inner trench isolation structure.

16. The integrated chip of claim 13, wherein the photodetector comprises a first semiconductor region and a second semiconductor region, wherein the first semiconductor region has a first doping type, the guard ring has the first doping type, and the second semiconductor region has a second doping type, different than the first doping type, wherein the guard ring laterally surrounds the first semiconductor region, and wherein the second semiconductor region is directly between the guard ring and the inner trench isolation structure.

17. The integrated chip of claim 16, wherein the inner trench isolation structure is spaced directly over the second semiconductor region.

18. The integrated chip of claim 13, wherein a width of the outer trench isolation structure is greater than a width of the inner trench isolation structure.

19. The integrated chip of claim 13, wherein the outer trench isolation structure surrounds the inner trench isolation structure in a second closed path.

20. The integrated chip of claim 13, wherein the inner trench isolation structure has a ring-shaped top layout.

* * * * *